US012232341B2

(12) United States Patent
Yajima et al.

(10) Patent No.: US 12,232,341 B2
(45) Date of Patent: Feb. 18, 2025

(54) PHOTOELECTRIC CONVERSION ELEMENT, LIGHT-RECEIVING ELEMENT INCLUDING THE SAME, PHOTOELECTRIC CONVERSION APPARATUS, MOBILE UNIT, METHOD FOR MANUFACTURING PHOTOELECTRIC CONVERSION FILM, AND METHOD FOR MANUFACTURING PHOTOELECTRIC CONVERSION ELEMENT

(71) Applicant: CANON KABUSHIKI KAISHA, Tokyo (JP)

(72) Inventors: Takahiro Yajima, Kanagawa (JP); Takayuki Sumida, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 506 days.

(21) Appl. No.: 17/532,441

(22) Filed: Nov. 22, 2021

(65) Prior Publication Data

US 2022/0085111 A1    Mar. 17, 2022

Related U.S. Application Data

(63) Continuation of application No. PCT/JP2020/019617, filed on May 18, 2020.

(30) Foreign Application Priority Data

May 27, 2019  (JP) .................................. 2019-098541

(51) Int. Cl.
*H10K 39/32*     (2023.01)
*H10K 30/10*     (2023.01)
(Continued)

(52) U.S. Cl.
CPC ............. *H10K 39/32* (2023.02); *H10K 30/10* (2023.02); *H10K 30/81* (2023.02); *B82Y 20/00* (2013.01); *B82Y 40/00* (2013.01); *H10K 2102/00* (2023.02)

(58) Field of Classification Search
CPC ........ H10K 39/32; H10K 30/10; H10K 30/81; H10K 2102/00; B60R 11/04;
(Continued)

(56) References Cited

U.S. PATENT DOCUMENTS

2015/0287878 A1    10/2015  Ono
2016/0133463 A1     5/2016  Luther
2020/0343487 A1*   10/2020  Han ...................... H10K 50/13

FOREIGN PATENT DOCUMENTS

JP     2014143397 A    8/2014
KR    20130114436 A   10/2013

OTHER PUBLICATIONS

Wang, et al. "Colloidal quantum dot ligand engineering for high performance solar cells", Energy & Environmental Science, Dec. 2015.
(Continued)

*Primary Examiner* — Evan G Clinton
(74) *Attorney, Agent, or Firm* — CANON U.S.A., INC. IP DIVISION

(57) ABSTRACT

An embodiment according to the present disclosure provides a photoelectric conversion element including a first electrode, a second electrode, and a photoelectric conversion layer disposed between the first electrode and the second electrode, wherein the photoelectric conversion layer includes a first region, a second region disposed between the first region and the second electrode, and a third region that is disposed between the second region and the second electrode and that is in contact with the second region, the inorganic ligand ratio in the second region is higher than the
(Continued)

inorganic ligand ratio in the first region, the inorganic ligand ratio at the interface of the third region to the second region is lower than the inorganic ligand ratio in the first region, and the inorganic ligand ratio in the second region increases with increasing proximity to the third region.

18 Claims, 7 Drawing Sheets

(51) Int. Cl.
    *H10K 30/81*     (2023.01)
    *B82Y 20/00*     (2011.01)
    *B82Y 40/00*     (2011.01)
    *H10K 102/00*     (2023.01)

(58) Field of Classification Search
CPC ... B60R 2011/004; B82Y 20/00; B82Y 40/00; Y02E 10/549
See application file for complete search history.

(56) References Cited

OTHER PUBLICATIONS

Hong, et al. "Enhanced charge carier transport properties in colloidal quantum dot solar cells via organic and inorganic hybrid surface passivation", Journals of Materials Chemistry A, 2016.
Ip, et al. "Hybrid passivated collodial quantum dot solids", Nature Nanotechnology, Jul. 2012.
Clark, et al., Influence of Multistep Surface Passivation of the Performance of PbS Colloidal Quantum Dot Solar Cells, Langmuir, Jul. 2018.
Neo, et al., "Influence of Shell Thickness and Surface Passivation on PbS/CdS Core/Shell Colloidal Quantum Dot Solar Cells", Chemistry of Materials, 2014.
Yang, et al., "Novel Hybrid Ligands for Passivating PbS Colloidal Quantum Dots to Enhance the Performance of Solar Cells", Nano-Micro Letters, 2015.
Böhm, et al., "Size and Energy Level Tuning of Quantum Dot Solids via a Hybrid Ligand Complex", Journal of Physical Chemistry Letters, Aug. 2015.

* cited by examiner

PHOTOELECTRIC CONVERSION ELEMENT, LIGHT-RECEIVING ELEMENT INCLUDING THE SAME, PHOTOELECTRIC CONVERSION APPARATUS, MOBILE UNIT, METHOD FOR MANUFACTURING PHOTOELECTRIC CONVERSION FILM, AND METHOD FOR MANUFACTURING PHOTOELECTRIC CONVERSION ELEMENT

CROSS-REFERENCE TO RELATED APPLICATIONS

This application is a Continuation of International Patent Application No. PCT/JP2020/019617, filed May 18, 2020, which claims the benefit of Japanese Patent Application No. 2019-098541, filed May 27, 2019, both of which are hereby incorporated by reference herein in their entirety.

TECHNICAL FIELD

The present invention relates to a photoelectric conversion element, a light-receiving element including the same, a photoelectric conversion apparatus, a mobile unit, a method for manufacturing a photoelectric conversion film, and a method for manufacturing a photoelectric conversion element.

BACKGROUND ART

A quantum dot which has a plurality of inorganic particles and which converts received light to electricity has attracted attention. This is because the quantum dot has sensitivity to light in a near-infrared region so as to be able to obtain an image with high sensitivity even in a dark place and, therefore, can be used for an image sensor (imaging apparatus) serving as a security measure, for example, a surveillance camera.

It is known that quantum dot materials are composed of a plurality of inorganic particles formed from compound semiconductors. A molecule disposed on an inorganic particle surface and bonded by a covalent bond is referred to as a ligand.

It is known that a quantum dot is provided with an organic compound ligand or an inorganic material ligand on the surface and that the properties of the quantum dot can be controlled in accordance with the type of the ligand. As a known example, an organic ligand such as benzenedithiol having a benzene ring improves the electric conductivity of an inorganic particle. However, since the organic ligand has a three-dimensional structure, the ligand may have large bulk, and a ligand having a large excluded volume is difficult to sufficiently cover an inorganic particle. As a result, a surface defect of the inorganic particle is not limited to being sufficiently suppressed.

On the other hand, an inorganic ligand containing a halogen atom has a small size and, therefore, can widely cover the inorganic particle surface compared with the organic ligand. As a result, a surface defect of the inorganic particle can be reduced compared with an instance in which just the organic ligand is included. However, when only the inorganic ligand is included, the distance between adjacent inorganic particles is reduced to the order of a halogen atom. That is, the function of a spacer is not limited to being sufficiently performed by the inorganic ligand alone.

It is known that both the inorganic ligand and the organic ligand are disposed to reduce a surface defect of the inorganic particle and to improve the electric conductivity of the inorganic particle.

PTL 1 discloses that the stability of the quantum dot is improved by disposing an inorganic ligand having halogen on the surface of the quantum dot having an organic ligand on the surface.

NPL 1 discloses that after the organic ligand is disposed on the surface of a quantum dot, an inorganic ligand having a halogen atom is added. It is disclosed that the inorganic ligand being added repairs a surface defect of a nanoparticle not bonded to a long ligand having a relatively large molecular length such as oleic acid added during synthesis so as to improve the electric conductivity of a quantum dot film.

CITATION LIST

Patent Literature

PTL 1 U.S. Patent Application Publication No. 2016/0133463

Non Patent Literature

NPL 1 Ruili Wang. et al., "Colloidal quantum dot ligand engineering for high performance solar cells", Energy & Environmental Science, 2016, 4, 1117-1516

PTL 1 and NPL 1 describe quantum dots having an inorganic ligand and an organic ligand on the surface of the inorganic particle. However, according to the production conditions for these quantum dots, a reduction of surface defect of the quantum dot film is insufficient, and the photocurrent density is insufficient. To improve the performance of the photoelectric conversion film, an improvement of the photocurrent density of a photoelectric conversion element including a quantum dot has been desired.

SUMMARY OF INVENTION

The present disclosure provides a photoelectric conversion element having a high photocurrent density due to a reduction of a surface defect of a quantum dot.

An embodiment according to the present disclosure provides a photoelectric conversion element including a first electrode, a second electrode, and a photoelectric conversion layer disposed between the first electrode and the second electrode, wherein the photoelectric conversion layer includes a first region, a second region disposed between the first region and the second electrode, and a third region that is disposed between the second region and the second electrode and that is in contact with the second region, the inorganic ligand ratio in the second region is higher than the inorganic ligand ratio in the first region, the inorganic ligand ratio at the interface of the third region to the second region is lower than the inorganic ligand ratio in the first region, and the inorganic ligand ratio in the second region increases with increasing proximity to the third region.

Further features of the present invention will become apparent from the following description of exemplary embodiments with reference to the attached drawings.

DESCRIPTION OF EMBODIMENTS

Figure 1A:
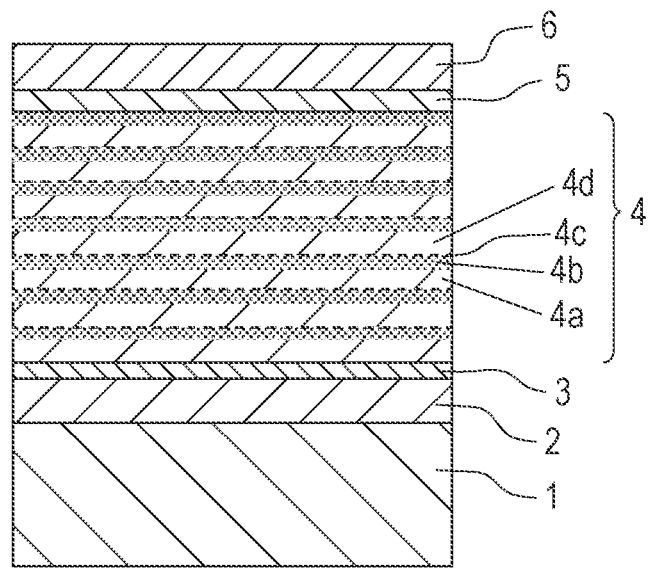
FIG. 1A is a schematic sectional view illustrating an example of a photoelectric conversion element according to an embodiment of the present disclosure.
Figure 1B:
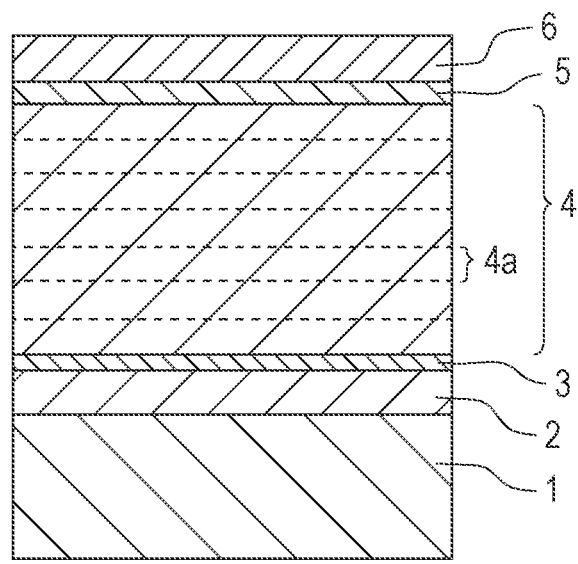
FIG. 1B is a schematic sectional view illustrating an example of a photoelectric conversion element in the related art.
Figure 2:
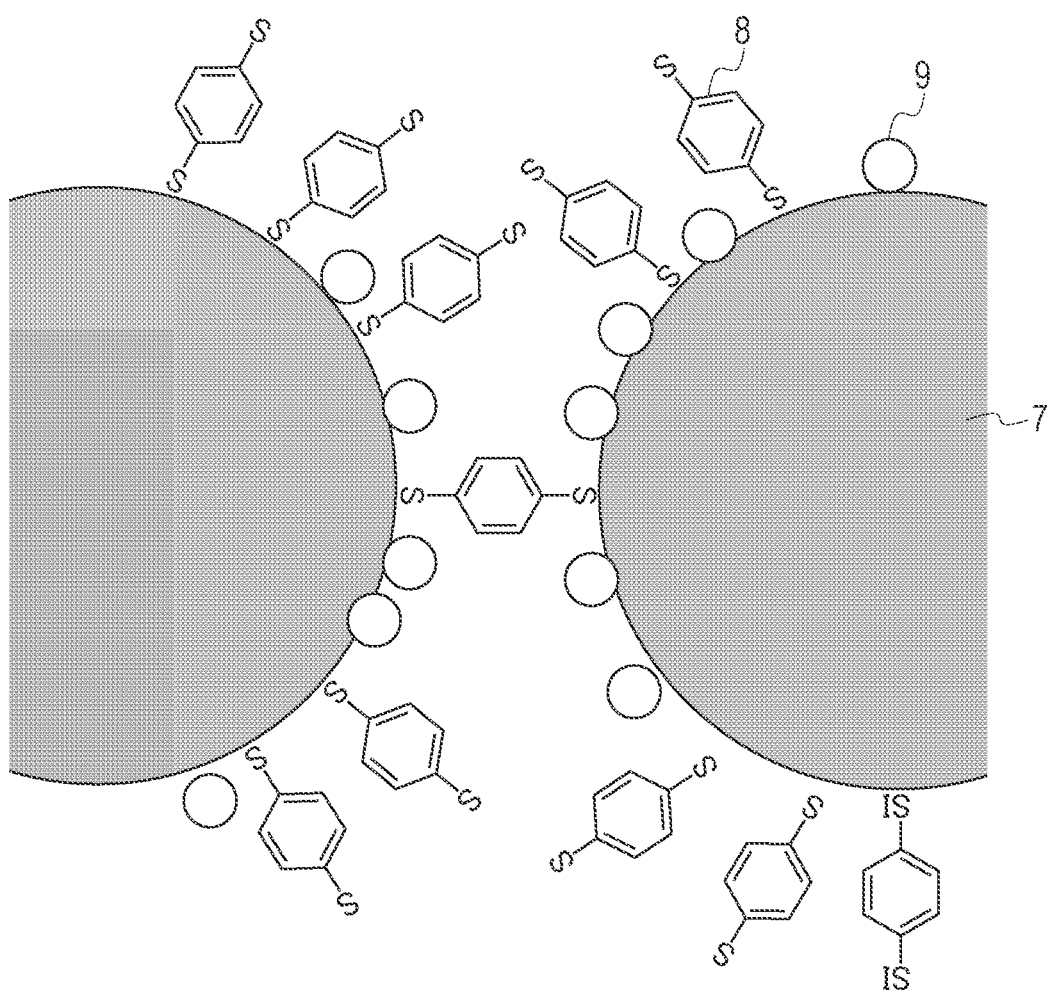
FIG. 2 is a schematic diagram illustrating an example of an inorganic ligand and an organic ligand of a quantum dot film according to an embodiment of the present disclosure.

A photoelectric conversion element according to an embodiment of the present disclosure includes a first electrode, a second electrode, and a photoelectric conversion layer disposed between the first electrode and the second electrode, wherein the photoelectric conversion layer includes a first region, a second region disposed between the first region and the second electrode, and a third region that is disposed between the second region and the second electrode and that is in contact with the second region, the inorganic ligand ratio in the second region is higher than the inorganic ligand ratio in the first region, the inorganic ligand ratio at the interface of the third region to the second region is lower than the inorganic ligand ratio in the first region, and the inorganic ligand ratio in the second region increases with increasing proximity to the third region.

The photoelectric conversion layer includes a first photoelectric conversion layer and a second photoelectric conversion layer disposed between the first photoelectric conversion layer and the second electrode. The first photoelectric conversion layer includes the first region, the second region disposed between the first region and the second electrode, and the third region that is disposed between the second region and the second electrode and that is in contact with the second region, the first region is a region having a lower inorganic ligand ratio than the second region, and the third region is a region having a lower inorganic ligand ratio than the first region.

In the second region of the photoelectric conversion layer according to an embodiment of the present disclosure, the inorganic ligand ratio increases with increasing proximity to the third region. That is, the inorganic ligand ratio increases with increasing proximity to the second photoelectric conversion layer. "Increase" may be ascertained by measuring a plurality of points in the second region and checking that the value increases with increasing proximity to the third region. Further, it is preferable that the inorganic ligand ratio monotonously increase. "Monotonously increase" denotes "increase without change to decrease" with increasing proximity to the third region. A region with no changes in the ratio may be included between regions in which the ratio increases, and it is desirable that no region without change in the ratio be included.

The inorganic ligand ratio in the first region may increase with increasing proximity to the second region. In such an instance, the increase rate of the inorganic ligand ratio in the first region may be more than the increase rate of the inorganic ligand ratio in the second region. Since the inorganic ligand ratio in the first region is changed by permeation of the inorganic ligand in the second region, the increase rate of the inorganic ligand ratio is less than that in the second region.

A difference between the maximum value of the inorganic ligand ratio in the second region and the minimum value of the inorganic ligand ratio in the second region is less than a difference between the maximum value of the inorganic ligand ratio in the second region and the average value of the inorganic ligand ratio in the third region. The third region is disposed closer than the second region to the second electrode. The inorganic ligand ratio of the second region increases due to permeation of the inorganic ligand every time a region such as the third region closer than the second region to the second electrode is formed, and the number of times of permeation of the inorganic ligand into the third region is less than that into the second region.

The photoelectric conversion element according to an embodiment of the present disclosure may include a first photoelectric conversion layer and a second photoelectric conversion layer between the first electrode and the second electrode, the second photoelectric conversion layer being disposed between the first photoelectric conversion layer and the second electrode. In such an instance, the first region and the second region may be included in the first photoelectric conversion layer, and the third region may be included in the second photoelectric conversion layer.

The photoelectric conversion layer is composed of a quantum dot. The inorganic ligand on the quantum dot surface may have a halogen atom. In such an instance, the inorganic ligand may also be referred to as a halogen ligand. The number of the inorganic ligands or the halogen ligands can be estimated from the peak height in TOF-SIMS.

That is, the maximum peak in TOF-SIMS attributed to the inorganic ligand in the second region is higher than the maximum peak in TOF-SIMS attributed to the inorganic ligand in the first region. The maximum peak in TOF-SIMS attributed to the inorganic ligand in the third region is lower than that in the first region.

The first photoelectric conversion layer disposed closer to the first electrode has a higher inorganic ligand ratio than the second photoelectric conversion layer disposed closer to the second electrode. It is conjectured that the cause of this is due to an exchange solution permeating toward the first electrode, the exchange solution switching the ligand to the inorganic ligand. That is, the maximum peak in TOF-SIMS attributed to the inorganic ligand in the first photoelectric conversion layer is higher than the maximum peak in TOF-SIMS attributed to the inorganic ligand in the second photoelectric conversion layer.

The maximum peak in TOF-SIMS attributed to a halogen atom in the third region is lower than the maximum peak in TOF-SIMS attributed to a halogen atom in the first region. The cause of this is due to the third region having a lower inorganic ligand ratio than the first region.

The first region and the second region of the photoelectric conversion layer having different inorganic ligand ratios indicate that a ligand exchange by using an inorganic ligand is performed after, for example, the first photoelectric conversion layer is formed by coating or the like. Examples include a solid-phase ligand exchange rather than a liquid-phase ligand exchange. A surface defect of a quantum dot can be reduced by performing ligand switching to an inorganic ligand in a step after switching to an organic ligand in a solid phase. The cause of this is due to an inorganic ligand which has a small particle diameter entering details of an organic ligand with a large excluded volume and coordinating with a surface defect of the quantum dot. Consequently, an inorganic ligand having a halogen atom is preferable since the halogen atom has a small atomic radius. Of these, coordination including a halogen atom having a small atomic radius is preferable.

Regarding the photoelectric conversion element according to an embodiment of the present disclosure, the thickness of the first region in the direction from the first electrode toward the second electrode may be more than the thickness of the second region. That is, the second region has a smaller thickness than the first region.

The total of the thickness of the first region and the thickness of the second region may be more than the thickness of the third region. The third region has a layer thickness smaller than the total thickness of the first region and the second region.

Regarding the photoelectric conversion element according to an embodiment of the present disclosure, the standard deviation of the inorganic ligand ratio in the first region may be less than the standard deviation of the inorganic ligand ratio in the second region. It is indicated that the dispersion of the inorganic ligand in the thickness direction of the second region is more than the dispersion of the inorganic ligand in the thickness direction of the first region. Since the inorganic ligand ratio monotonously increases in the second region, large dispersion indicates that the increase rate is large.

The standard deviation of the inorganic ligand ratio in the second region may be more than the standard deviation of the inorganic ligand ratio in the third region. It is indicated that the dispersion of the inorganic ligand in the thickness direction of the second region is more than the dispersion of the inorganic ligand in the thickness direction of the third region.

Regarding the photoelectric conversion element according to an embodiment of the present disclosure, since a halogen atom coordinates with a surface defect of a quantum dot constituting the photoelectric conversion layer so as to reduce the surface defect, the photocurrent density is high. As a further effect, since a surface defect is reduced, a dark current is small.

A quantum dot according to an embodiment of the present disclosure has an organic ligand and an inorganic ligand on the surface. The inorganic ligand ratio of the quantum dot may be more than the organic ligand ratio of the quantum dot. The ratio of the ligand disposed on the surface of the quantum dot can be adjusted by the conditions for providing the quantum dot with the ligand. The ratio of the ligand on the surface of the quantum dot may be adjusted in a liquid phase and may also be adjusted in a solid phase in which the quantum dot film is formed.

Material for Forming Quantum Dot

A quantum dot is an aggregate of a plurality of inorganic particles. An inorganic particle used for a quantum dot is also referred to as a nanoparticle because of the size thereof. Examples of the material for forming the quantum dot include nanoparticles of group IV semiconductors, group III-V or group II-VI compound semiconductors, compound semiconductors produced by combining at least three elements of group II, group III, group IV, group V, and group VI, and the like, which are semiconductor crystals. Specific examples include semiconductor materials having a relatively narrow band gap such as PbS, PbSe, InN, InAs, Ge, InGaAs, CuInS, CuInSe, CuInGaSe, InSb, Si, and InP. Of these, PbS or PbSe is preferable as the quantum dot material from the viewpoint of ease of synthesis and sensitivity to light up to an infrared region. A core-shell structure in which the material serves as a nucleus (core) of a quantum dot and the quantum dot material is covered with a covering compound may be adopted. In such an instance, a ligand is disposed in a shell portion.

The average particle diameter of the quantum dot is preferably 2 nm or more and 15 nm or less. Regarding the quantum dot, when the particle diameter of the quantum dot is reduced to less than or equal to the Bohr radius of an internal exciton, a phenomenon in which the band gap of the quantum dot is changed due to a quantum size effect occurs. For example, it is said that the group II-VI semiconductor has a relatively large Bohr radius, and that the Bohr radius of PbS is about 18 nm. It is said that the Bohr radius of InP which is the group III-V semiconductor is about 10 nm to 14 nm. That is, when the average particle diameter of the quantum dot is 15 nm or less, regarding both PbS and InP, the band gap can be controlled by the quantum size effect. In synthesis of a quantum dot, the average particle diameter of the quantum dot being set to be 2 nm or more enables crystal growth of the quantum dot to be readily controlled. The absorption wavelength can be selected by selecting the particle. Specifically, Pb or PbS being selected enables infrared rays to be absorbed and an infrared sensor to be formed.

The quantum dot has a ligand on the surface. The ligand is roughly divided into an inorganic ligand and an organic ligand. When the photoelectric conversion layer includes a first quantum dot and a second quantum dot, the organic ligand may has a cross-linking structure to cross-link the two. "Cross-linking" denotes a molecule bonding to the first quantum dot and the second quantum dot. When cross-linking is performed by the organic ligand, the distance between quantum dots can be controlled by the molecular length of the organic ligand. Specific structure to perform cross-linking may be a hydroxy group, a thiol group, or a carboxy group. In this regard, quantum dots cross-linked by a hydroxy group are bonded through an ether bond, quantum dots cross-linked by a thiol group are bonded through a sulfur atom, and quantum dots cross-linked by a carboxy group are bonded through an ester bond.

Synthesis of Quantum Dot

Regarding a method for manufacturing a PbS particle as an example of the quantum dot, for example, production may be performed as described below. Lead(II) oxide serving as a lead (Pb) precursor solution, oleic acid serving as an organic ligand, and octadecene serving as a solvent are placed into a three neck flask. The interior of the flask is replaced with nitrogen, and the Pb precursor solution is heated to 90° C. in an oil bath so as to react the lead oxide with the oleic acid. Thereafter, heating to 120° C. is performed so as to generate a PbS quantum dot. An octadecene solution of bistrimethylsilyl sulfide is separately prepared as a sulfur (S) precursor solution. The S precursor solution is rapidly injected into the Pb precursor solution heated to 120° C. so that a reaction is made to occur. After the reaction is completed, natural cooling to room temperature is performed, methanol or acetone serving as a polar solvent is added, and centrifugal separation is performed so as to precipitate a PbS particle. After the supernatant is removed, toluene is added, and washing is performed so as to redisperse the PbS particle. Excess oleic acid and unreacted products are removed by repeating the centrifugal separation step and the redispersion step a plurality of times, and, finally, a quantum dot dispersion liquid in which the quantum dot is dispersed can be produced by adding a solvent such as octane.

A halogen inorganic ligand having a halogen atom can be added to the PbS particle that is an example of the quantum dot by using the method described in NPL 1 or the like. Specifically, tetrabutylammonium iodide $C_{16}H_{36}NI$: TBAI is used as the halogen ligand. The S precursor solution is rapidly injected into the above-described Pb precursor solution heated to 120° C. so that the reaction is made to occur. Thereafter, the precursor solution produced by using the halogen ligand TBAI is added. The ratio of the oleic acid to the halogen atom can be adjusted by adjusting the reaction temperature and the amount of halogen ligand added.

Provision of the inorganic ligand may be performed in a liquid phase but may be performed in a solid phase in which the quantum dot film is produced and, thereby, the quantum dot surface can be provided with many inorganic ligands.

Organic Ligand Having Large Molecular Chain Length

An organic ligand having a large molecular chain length is a ligand composed of an organic compound having a relatively large carbon atom number. The organic ligand may be composed of an organic compound having a boiling temperature of 200° C. or higher. The ligand included in a quantum dot dispersion liquid functions as a ligand that coordinates with the quantum dot and has a molecular structure that readily becomes a steric hindrance so as to also play a role as a dispersing agent to disperse the quantum dot in a solvent. The ligand is classified into a ligand having a larger molecular chain length and a ligand having a smaller molecular chain length. In this regard, when a molecule has a branched structure, the relative length of the molecular chain length is determined in accordance with the length of the main chain. The ligand having a small molecular chain length is essentially difficult to disperse in an organic solvent system. In this regard, "dispersion" denotes a state in which there is no precipitation of the particle nor muddiness. From the viewpoint of improving dispersion of the quantum dot, the ligand having a large molecular chain length is desirably a ligand having a carbon number of the main chain of at least 6 and more desirably a ligand having a carbon number of the main chain of at least 10. Specifically, either a saturated compound or an unsaturated compound may be adopted, and examples include decanoic acid, lauric acid, myristic acid, palmitic acid, stearic acid, behenic acid, oleic acid, erucic acid, oleylamine, dodecylamine, dodecane thiol, 1,2-hexadecane thiol, trioctylphosphine oxide, and cetrimonium bromide. Regarding the ligand having a large molecular chain length, a ligand that does not remain in a film during formation of a photoelectric conversion film is preferable, and of the above-described ligands, at least one of oleic acid and oleylamine is preferable from the viewpoint of the quantum dot being provided with dispersion stability and difficulty in remaining in the photoelectric conversion film.

There is no particular limitation regarding the quantum dot solvent included in the quantum dot dispersion liquid, and it is preferable that the solvent not readily dissolve the quantum dot and readily dissolve a ligand having a large molecular chain length. The quantum dot solvent is preferably an organic solvent, and specific examples include alkanes (n-hexane, n-octane, and the like), benzene, and toluene.

Organic Ligand Having Relatively Small Molecular Chain Length

An organic ligand having a small molecular chain length is a ligand composed of an organic compound having a relatively small carbon atom number. The organic ligand may be composed of an organic compound having a boiling temperature of 200° C. or higher. Regarding the organic ligand having a relatively small molecular chain length, a ligand having a small molecular chain length has a smaller molecular chain length than a ligand having a large molecular chain length and is at least one ligand selected from the group consisting of ligands such as ethane dithiol, benzene dithiol, dibenzene dithiol, mercaptobenzoic acid, dicarboxybenzene, and organic compounds including benzenediamine or dibenzenediamine. More specifically, the ligand may be selected from 1,3-benzene dithiol, 1,4-benzene dithiol, 3-mercaptobenzoic acid, and 4-mercaptobenzoic acid. In particular, the ligands such as benzene dithiol having a benzene ring are preferable since the boiling temperature is higher than 200° C. Since vaporization of the ligand is suppressed even at a high temperature of 140° C. or higher, the heat resistance of the quantum dot film is high. There is no particular limitation regarding the ligand solvent contained in the ligand solution, and an organic solvent having a high permittivity is preferable. In particular, ethanol, acetone, methanol, acetonitrile, dimethylformamide, butanol, propanol, and the like are preferable.

Inorganic Ligand

An inorganic ligand is a ligand composed of an inorganic compound. Preferably, a halogen atom is included. The inorganic ligand having a halogen atom is at least one ligand selected from ligands such as lead fluoride PbF, lead(II) chloride $PbCl_2$, lead(II) iodide $PbI_2$, lead(II) bromide $PbBr_2$, and tetrabutylammonium iodide $C_{16}H_{36}NI$: TBAI. Many inorganic ligands composed of halogen-based inorganic material being included enables the quantum dot surface to be sufficiently covered. Since the halogen has a small atomic radius, many surface defects can be covered. Regarding provision of the inorganic ligand, a halogen atom may be added in a liquid phase during synthesis. Alternatively, in a liquid phase, a halogen atom may be added in a state of quantum dot dispersion liquid. In addition, regarding provision of the inorganic ligand, in a solid phase, a halogen atom may be added to the quantum dot film.

Photoelectric Conversion Element

FIG. 1A is a schematic sectional view illustrating an example of a photoelectric conversion element according to an embodiment of the present disclosure. A first electrode layer 2, a first interface layer 3, a photoelectric conversion layer 4, a second interface layer 5, and a second electrode 6 are disposed on a substrate 1. The first electrode and the second electrode may be collectively referred to as a pair of electrodes. The photoelectric conversion layer 4 may be composed of a plurality of quantum dot films 4a. A cap layer 4b is disposed between a first photoelectric conversion layer (quantum dot film 4a) and a second photoelectric conversion layer (quantum dot film 4a). The cap layer is a region having a larger number of halogen atoms than other regions in the photoelectric conversion layer. An interface 4c is just above the cap layer and is an interface between the first photoelectric conversion layer and the second photoelectric conversion layer.

The photoelectric conversion element according to an embodiment of the present disclosure is an element including the first electrode, second electrode, and the photoelectric conversion layer disposed between the first electrode and the second electrode. The photoelectric conversion layer is a layer to convert received light to an electric charge. The converted electric charge is polarized and is collected by any one of the pair of electrodes. The photoelectric conversion layer may has a configuration in which an electric field is applied from the first electrode and the second electrode. The pair of electrodes are an electrode to collect a hole and an electrode to collect an electron. The electrode to collect a hole is referred to as a positive electrode or a cathode. The electrode to collect an electron is referred to as a negative electrode or an anode. At least one of the pair of electrodes may be transparent.

In the photoelectric conversion element, an interface layer may be disposed between the photoelectric conversion layer and at least one of the pair of electrodes. The interface layer may function as an electron block layer or a hole block layer. The electron block layer is a layer to suppress an electron from moving from the photoelectric conversion layer to the cathode, and the hole block layer is a layer to suppress a hole from moving from the photoelectric conversion layer to the anode.

Photoelectric Conversion Layer

The photoelectric conversion layer according to an embodiment of the present disclosure may be a quantum dot aggregate. The quantum dot may have an inorganic ligand and an organic ligand.

Many inorganic ligands being included on the surface of the quantum dot film enables a dangling bond to be sealed and enables the defect level to be lowered. Lowering of the defect level can reduce a dark current, improve a photocurrent density, and improve sensitivity to light. There is no particular limitation regarding the thickness of the photoelectric conversion layer, and the thickness is preferably 10 nm or more and more preferably 50 nm or more from the viewpoint of acquisition of high electric conductivity and light absorption characteristics. In addition, the thickness of the photoelectric conversion layer is preferably 800 nm or less from the viewpoint of avoiding the carrier concentration from being excessive and ease of production.

The following is an example of a method for manufacturing a photoelectric conversion element according to an embodiment of the present disclosure.

The manufacturing method includes a step of preparing a first electrode, a first step of providing the first electrode with a quantum dot, a second step of providing the quantum dot with an organic ligand by providing the quantum dot with a solution containing an organic material after the first step, a third step of providing the quantum dot with an inorganic ligand by providing the quantum dot with a solution containing an inorganic material after the second step, and a step of forming a second electrode. A step of pretreating the quantum dot may be included before the first step. The pretreatment step is a step of disposing a ligand on the quantum dot surface. The ligand disposed may be an inorganic ligand. The inorganic ligand used for the pretreatment of the quantum dot may have a halogen atom. Examples include tetrabutylammonium iodide ($C_{16}H_{36}NI$, also known as TBAI).

First Step

A quantum dot is disposed on the electrode, substrate, or the like so that a photoelectric conversion layer can be produced. There is no particular limitation regarding a method for manufacturing the photoelectric conversion layer having a configuration in which an aggregate of nanoparticles is included as a quantum dot. When the quantum dot in the state of being modified by a ligand having a large molecular chain length such as oleic acid is dispersed in a solvent, the quantum dot does not readily gather to take on a bulky state. There is no particular limitation regarding the technique to provide the substrate with a quantum dot dispersion liquid, and examples include a method in which a substrate is coated with the quantum dot dispersion liquid and a method in which a substrate is dipped in the quantum dot dispersion liquid. Regarding the method in which a substrate is coated with the quantum dot dispersion liquid, specifically a liquid phase method such as a spin coating method, a Cat method, a dip coating method, a blade coating method, a spray coating method, an ink jet method, a dispenser method, a screen printing method, a letterpress printing method, or an intaglio printing method may be used. In particular, an ink jet method, a dispenser method, a screen printing method, a letterpress printing method, and an intaglio printing method can pattern a coating film at any position on the substrate.

Second Step

After the substrate is provided with the quantum dot dispersion liquid, a photoelectric conversion layer can be formed by applying an organic ligand solution thereon so as to exchange ligands. When the substrate is provided with the quantum dot dispersion liquid, the quantum dot aggregate has a configuration in which each quantum dot is arranged. A method in which a quantum dot aggregate is formed and thereafter the distance between quantum dots is decreased by switching the ligand to an organic ligand having a small molecular chain length through ligand exchange can be used.

The length of the ligand of the quantum dot is decreased, as described above, to avoid a reduction in electrical conductivity. When a dot-dot distance (interval) of the quantum dot is large, the electrical conductivity is reduced. The distance being decreased enables the quantum dots to be densely arranged so that a photoelectric conversion layer of a large photocurrent can be obtained. However, fusion (known as necking) between quantum dots tends to occur with decreasing the distance. Fusing between quantum dots increases the size of the quantum dot and decreases the band gap. When the band gap is decreased, the resistance value is reduced, and a dark current increases. It is preferable that the distance between the quantum dots be not excessively small and not excessively large. That is, a distance at which the electrical conductivity is high and fusion is reduced is preferable. A molecule having a long molecular chain and a molecule having a short molecular chain being concurrently contained in accordance with the ligand exchange condition increases the electrical conductivity and reduces fusion.

Third Step

According to an embodiment of the present disclosure, after switching to the organic ligand, a solution containing an inorganic ligand may be further applied. the solution containing an inorganic ligand being applied enables a defect of the quantum dot surface to be reduced. The applied inorganic ligand may have a halogen atom.

The quantum dot surface is the outermost surface of the semiconductor material, and a bonding hand not bonded to a ligand is a dangling bond of an atom and forms a defect level that causes a carrier trap having an influence on the electrical conductivity. When the excluded volume of the ligand coordinating with the quantum dot surface is large, a region not including a ligand is generated around the ligand. That is, a defect region in which the quantum dot surface takes on a naked state is formed. The defect region may be a cause of a dark current since the state of not bonding in spite of having the bonding ability is unstable and serves as a defect level.

The inorganic ligand can coordinate with the periphery of a ligand having a large excluded volume since just the inorganic ligand is small and can coordinate with a small region. The inorganic ligand coordinating with the defect region repairs the defect remaining on the quantum dot. The switching to the inorganic ligand is performed at least one time and may be repeated a plurality of times. The switching to the inorganic ligand being repeated a plurality of times enables the defect to be more effectively repaired since the halogen atom sufficiently permeates into the interior of the quantum dot film.

Step of Stacking Photoelectric Conversion Layer

The photoelectric conversion layer can be stacked by performing the first step after the third step. Further, the first step to the third step being repeated enables the photoelectric conversion layers to be stacked.

Formation of the quantum dot aggregate and ligand exchange being repeated enables crazing and cracking of the photoelectric conversion layer including the quantum dot aggregate to be suppressed from occurring, enables the electrical conductivity to be increased, and the thickness of the photoelectric conversion layer to be increased. To remove excessive ligands and ligands eliminated from quantum dots, a remaining solvent, other impurities, and the like, a washing step may be included. Specifically, washing is performed by dipping the substrate provided with the quantum dot aggregate or the photoelectric conversion layer in at least one of the quantum dot solvent and the ligand solvent or by performing coating with the quantum dot solution or the ligand solution.

Other Steps

Formation of the photoelectric conversion layer may include a dispersion liquid drying step of drying the quantum dot dispersion liquid, a solution drying step of drying the ligand solution, and the like. Regarding drying, after the quantum dot aggregate serving as the photoelectric conversion layer is formed, heating to a temperature at which the solvent remaining in the quantum dot aggregate is dried is performed. After the ligand exchange step, heating to a solution drying temperature at which the ligand solution is dried is performed. Alternatively, leaving to stand at room temperature may be performed. Even in a nitrogen atmosphere, it is more favorable that heating be performed in an environment containing slight oxygen. Specifically, the quantum dot surface is oxidized by performing heating in an environment containing 1.0% or less of oxygen. The content of oxygen may be 0.1% or more.

Before the first step, the quantum dot may be provided with a second inorganic ligand by a second inorganic material different from the inorganic material provided after switching to the organic ligand. The second inorganic ligand may be an inorganic ligand different from the above-described inorganic ligand.

A halogen atom included in the inorganic ligand may differ from a halogen atom included in the second inorganic ligand. In particular, it is preferable that the atomic radius of the halogen atom included in the inorganic ligand be smaller than the atomic radius of the halogen atom included in the second inorganic ligand. That is, it is preferable that the atomic radius of the halogen atom included in the inorganic ligand provided last be smaller. Entering a small gap repairs a defect of the quantum dot.

Electronic devices such as photoelectric conversion elements, light-emitting diodes, light-receiving element arrays, image sensors, visual sensors, and imaging apparatuses are put to practical use by being solder-mounted on a printed circuit board or the like. A heating process at about 200° C. is used for a solder-mounting step. An electronic device such as an image sensor, a visual sensor, or an imaging apparatuses is housed in a package produced from a resin or ceramic and is glass-sealed for water resistance and protection against dust. Regarding a package-mounting step, fixing with an adhesive is performed, and thereafter electrical connection to extension wire of the package is performed by gold small-gage wire bonding or the like. A heating process at 145° C. or higher is adopted for curing the adhesive and performing wire bonding.

Further, when the image sensor, the visual sensor, or the imaging apparatus is used in a visible light region, a color filter capable of dispersing RGB and a microlens to gather light are used. The color filter and the microlens are composed of a resin in many instances, and a heating process at 150° C. or higher is adopted for curing the resin. The quantum dot material used for the image sensor, the visual sensor, or the imaging apparatus is required to have heat resistance to withstand the temperature of the heating process during the mounting step, the color filter step, and the microlens step.

Therefore, the ligand having a high boiling temperature being disposed enables a quantum dot having excellent heat resistance to be formed. The ligand having a high boiling temperature may be an organic ligand. the quantum dot having excellent heat resistance can be used for various apparatuses.

Interface Layer

To improve the electrical characteristics, an upper interface layer and a lower interface layer may be disposed between the photoelectric conversion layer and the electrode (upper electrode layer, lower electrode layer). The electrode to collect a hole (positive electrode) may be provided with a layer to block an electron and to conduct just a hole (electron block layer), and the electrode to collect an electron (negative electrode) may be provided with a layer to block a hole and conduct just an electron (hole block layer).

The material for forming the electron block layer is preferably a material capable of efficiently transporting a hole generated in the photoelectric conversion layer to the positive electrode. Consequently, it is preferable that the positive electrode interface layer material have properties such as high hole mobility, high conductivity, a low hole injection barrier to the positive electrode, and a low hole injection barrier to a p-type semiconductor layer from the photoelectric conversion layer. Further, when light is taken into the photoelectric conversion layer through the electron block interface layer, preferably, a material having high transparency is used as the material for forming the electron block interface layer. When visible light, among the light, is taken into the photoelectric conversion layer, it is preferable that a material having visible-light transmittance of 60% or more and particularly 80% or more be used as the material for forming the transparent electron block interface layer. From such a viewpoint, the materials for forming the electron block interface layer are preferably p-type semiconductor materials, for example, inorganic semiconductors such as molybdenum oxide $MoO_3$ and nickel oxide NiO.

On the other hand, the function required of the hole block layer is to block a hole separated from the photoelectric conversion layer and to transport an electron to the negative electrode. Therefore, regarding the description of the electron block layer above, positive electrode is replaced with negative electrode, p-type semiconductor is replaced with n-type semiconductor, and hole is replaced with electron. In consideration of a configuration in which the light is applied from the negative-electrode side and effective utilization of the light reflected from the negative-electrode side, preferably, the hole block layer has high transmittance. From such a viewpoint, it is preferable that the material for forming the hole block interface layer be an n-type semiconductor material selected from inorganic semiconductors such as titanium oxide $TiO_2$ and organic semiconductors such as fullerene and fullerene derivatives.

Electrode

The electrode may be a pair of electrodes composed of an upper electrode layer and a lower electrode layer, a first electrode and a second electrode, or the like. The electrode may be formed of any material having conductivity. Examples of the constituent material for the electrode include metals such as platinum, gold, silver, aluminum, chromium, nickel, copper, titanium, magnesium, calcium, barium, and sodium or alloys thereof, metal oxides such as indium oxide and tin oxide or complex oxides thereof (for example, ITO and IZO), conductive polymers such as polyacetylenes, and conductive complex materials in which conductive particles such as metal particles, carbon black, fullerene, and carbon nanotube are dispersed in a matrix such as a polymer binder. In this regard, the constituent materials for the electrode may be used alone, or at least two types may be used in any combination and in any ratio.

The electrode has a function of collecting an electron or a hole generated inside the photoelectric conversion layer. Therefore, it is preferable that constituent materials, of the above-described materials, suitable for collecting an electron or a hole be used as the constituent material of the electrode. Examples of the electrode material suitable for collecting a hole include materials having a high work function such as Au and ITO. On the other hand, examples of the electrode material suitable for collecting an electron include materials having a low work function such as Al. There is no particular limitation regarding the thickness of the electrode. The thickness is appropriately determined in consideration of the electrode material, conductivity, transparency, and the like and may be 10 nm or more and 100 μm or less.

Substrate

The substrate is provided with the quantum dot dispersion liquid. There is no particular limitation regarding the shape, the structure, the size, and the like of the substrate, and these are appropriately selected in accordance with the purpose. The structure of the substrate may be a single layer structure or a multilayer structure. Examples of the material used for forming the substrate include inorganic materials such as glass, silicon, and stainless steel and organic materials composed of resins, resin composite materials, or the like. In the instance of a silicon substrate, an integrated circuit may be disposed. A lower electrode, an insulating film, or the like may be disposed on the substrate, and, in such an instance, the quantum dot dispersion liquid is applied to the lower electrode or an underlying insulating film on the substrate.

When a wiring layer is disposed on a substrate composed of silicon or the like, the substrate including the wiring layer and the like is referred to as a substrate. When an interlayer insulating layer is disposed, the substrate including the interlayer insulating layer is referred to as a substrate.

The photoelectric conversion element includes a first electrode and a second electrode. The first electrode may be disposed on the substrate side.

Examples of Use of Photoelectric Conversion Element

The photoelectric conversion element according to an embodiment of the present disclosure may be used for a light-receiving element. The light-receiving element includes the photoelectric conversion element, a reading circuit to read an electric charge from the photoelectric conversion element, and a signal processing circuit to receive an electric charge from the reading circuit and to perform signal processing.

The photoelectric conversion element according to an embodiment of the present disclosure may be used for a photoelectric conversion apparatus. The photoelectric conversion apparatus includes an optical system having a plurality of lenses and a light-receiving element to receive the light passed through the optical system, and the light-receiving element is a light-receiving element including the photoelectric conversion element. The light-receiving element is an imaging element including the photoelectric conversion element according to an embodiment of the present disclosure and a signal processing circuit. The photoelectric conversion apparatus may be specifically a digital still camera or a digital video camera.

Figure 6:
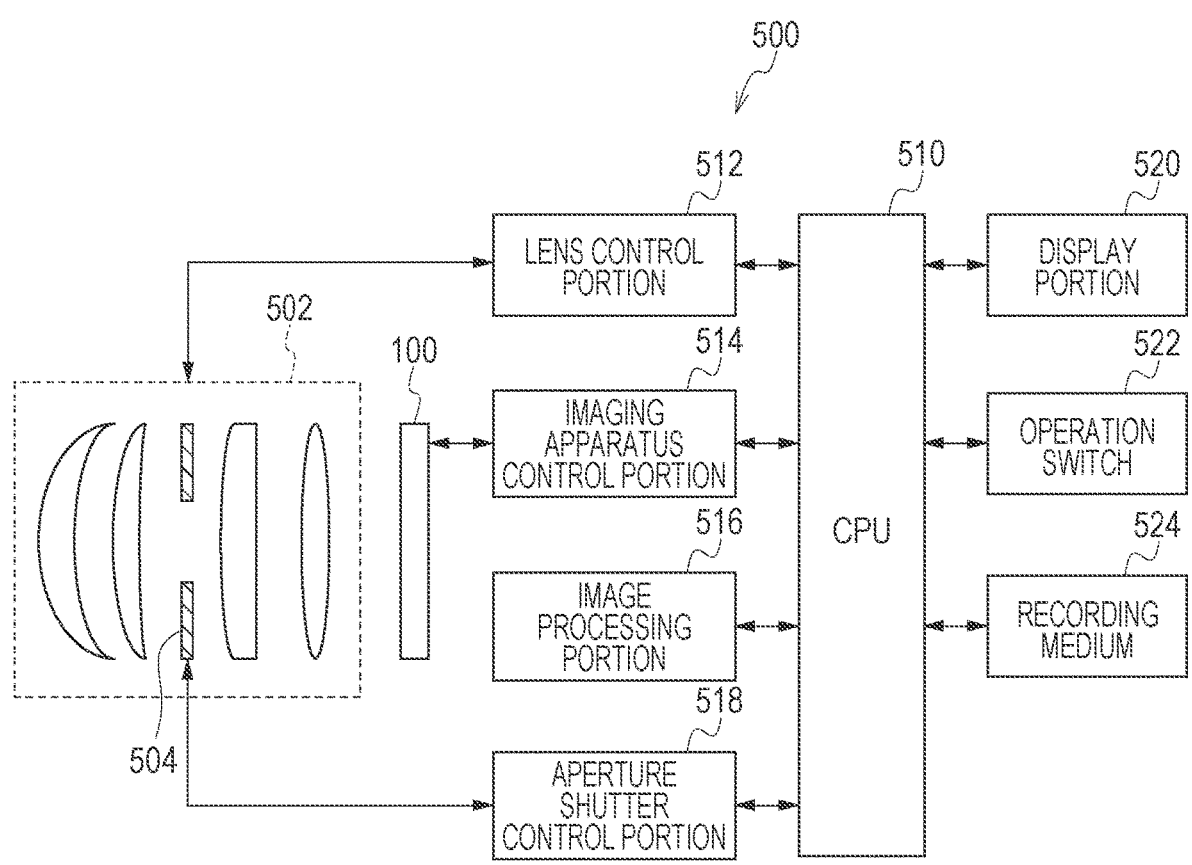
FIG. 6 is a diagram illustrating an example of an imaging system by using a photoelectric conversion element according to an embodiment of the present disclosure.

FIG. 6 is a diagram illustrating an example of an imaging system by using the photoelectric conversion element according to an embodiment of the present disclosure. As illustrated in FIG. 6, an imaging system 500 includes a photoelectric conversion apparatus 100, an imaging optical system 502, a CPU 510, a lens control portion 512, an imaging apparatus control portion 514, an image processing portion 516, an aperture shutter control portion 518, a display portion 520, an operation switch 522, and a recording medium 524.

The imaging optical system 502 is an optical system to form an optical image of a subject and includes a lens group, an aperture 504, and the like. The aperture 504 has a function of controlling the amount of the light during imaging by adjusting the opening diameter and, in addition, also has a function of an exposure time adjustment shutter during imaging of a still image. The lens group and the aperture 504 are held movably in the optical axis direction, and a scaling function (zoom function) and a focusing function are realized by operative association of these. The imaging optical system 502 may be integrated with the imaging system or be an imaging lens attachable to the imaging system.

The photoelectric conversion apparatus 100 is disposed with the imaging surface thereof being located in the image space of the imaging optical system 502. The photoelectric conversion apparatus 100 is the photoelectric conversion apparatus according to an embodiment of the present disclosure and is configured to include a CMOS sensor (pixel portion) and a peripheral circuit (peripheral circuit region) thereof. The photoelectric conversion apparatus 100 constitutes a two-dimensional single-chip color sensor by a plurality of pixels having a photoelectric conversion portion being two-dimensionally arranged and a color filter being arranged with respect to these pixels. The photoelectric conversion apparatus 100 performs photoelectric conversion of a subject image which is imaged by the imaging optical system 502 and outputs an image signal or a focal point detection signal.

The lens control portion 512 controls a movement operation of the lens group of the imaging optical system 502 so as to perform scaling operation and focusing and is composed of a circuit and a processing device configured to realize the function. The aperture shutter control portion 518 changes the opening diameter of the aperture 504 (aperture value is variable) so as to adjust the amount of imaging light and is composed of a circuit and a processing device configured to realize the function.

The CPU 510 is a control apparatus in a camera to govern various control of the camera main body and includes a computation portion, ROM, RAM, an A/D converter, a D/A converter, a communication interface circuit, and the like. The CPU 510 controls the action of each portion in the camera in accordance with the computer programs stored in ROM and the like so as to perform a series of imaging actions such as AF including detection of a focusing state of the imaging optical system 502 (focal point detection), imaging, image processing, and recording. The CPU 510 is also a signal processing portion.

The imaging apparatus control portion 514 controls the action of the photoelectric conversion apparatus 100, subjects the signal output from the photoelectric conversion apparatus 100 to A/D conversion so as to send to the CPU 510, and is composed of a circuit and a processing device configured to realize the functions. The photoelectric conversion apparatus 100 may be provided with the A/D conversion function. The image processing portion 516 forms an image signal by performing image processing such as y conversion and color interpolation with respect to the signal subjected to A/D conversion and is composed of a circuit and a processing device configured to realize the function. The display portion 520 is a display device such as a liquid crystal display device (LCD) and displays the information related to the imaging mode of the camera, a preview image before imaging, a check image after imaging, a focusing state during focal point detection, and the like. The operation switch 522 is composed of a power supply switch, a release (imaging trigger) switch, a zoom operation switch, an imaging mode selection switch, and the like. The recording medium 524 records imaged image and the like, may be incorporated in the imaging system, and may be a removable medium such as a memory card.

In this manner, formation of the imaging system 500 to which the photoelectric conversion apparatus 100 according to an embodiment of the present disclosure is applied enables a high-performance imaging system to be realized.

The photoelectric conversion apparatus according to an embodiment of the present disclosure may be used for a mobile unit. The mobile unit includes a bodywork provided with the photoelectric conversion apparatus and a movement device to move the bodywork. Specific examples include automobiles, aircraft, ships, and drones. The circumstances are imaged and the operation of the mobile unit may be supported by the photoelectric conversion apparatus being disposed on the mobile unit. The bodywork may be formed of metal or carbon fiber. Examples of the movement device include tires, magnetic levitation, and a mechanism to vaporize and eject a fuel.

Figure 7A:
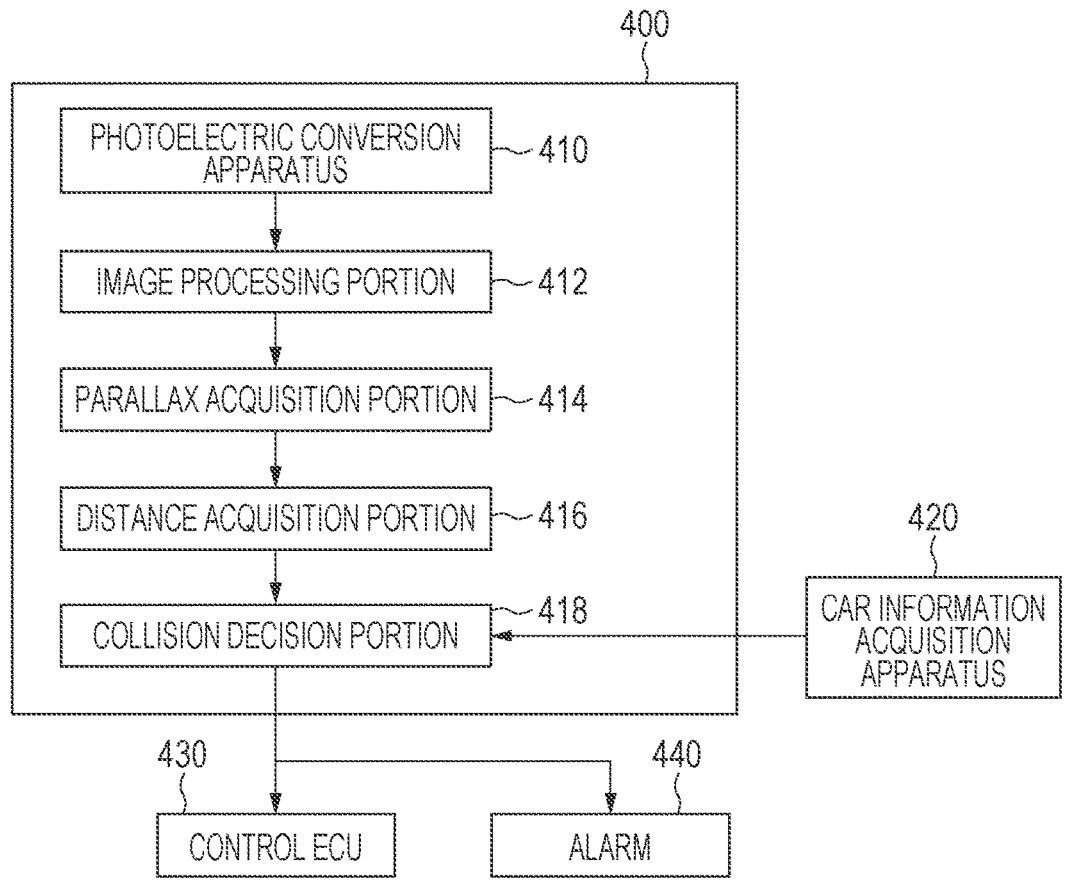
FIG. 7A is a diagram illustrating an example of an imaging system with respect to a car-mounted camera.
Figure 7B:
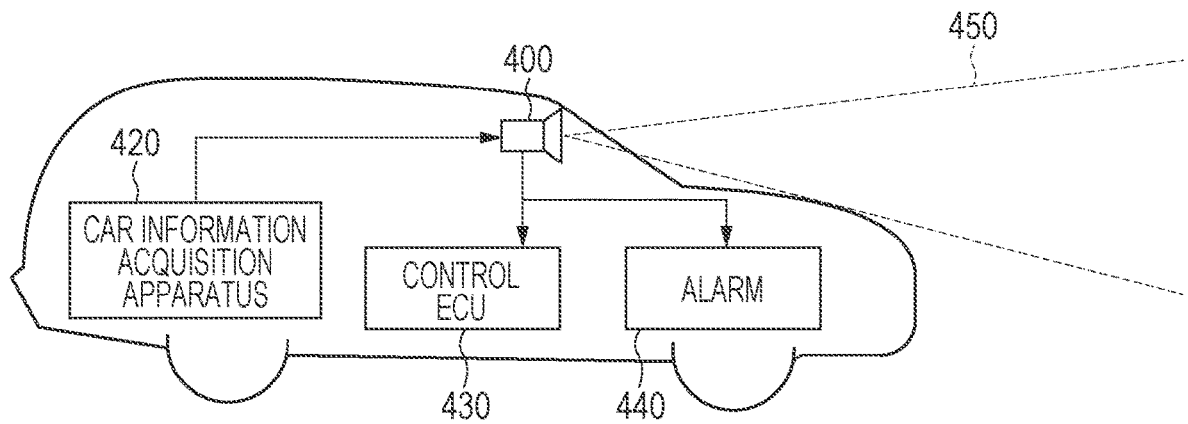
FIG. 7B is a schematic diagram illustrating an example of a mobile unit including a car-mounted camera.

FIG. 7A and FIG. 7B are diagrams illustrating the configuration of an imaging system and a mobile unit according to the present embodiment. FIG. 7A illustrates an example of an imaging system 400 with respect to a car-mounted camera. The imaging system 400 includes a photoelectric conversion apparatus 410. The photoelectric conversion apparatus 410 is the photoelectric conversion apparatus described in an embodiment of the present disclosure. The imaging system 400 includes an image processing portion 412 that is a processing apparatus to perform image processing with respect to a plurality of image data acquired by the photoelectric conversion apparatus 410 and a parallax acquisition portion 414 that is a processing apparatus to calculate parallax (phase difference of parallax image) from the plurality of image data acquired by the photoelectric conversion apparatus 410. In addition, the imaging system 400 includes a distance acquisition portion 416 that is a processing apparatus to calculate the distance to the subject on the basis of the calculated parallax and a collision decision portion 418 that is a processing apparatus to determine whether there is a possibility of collision on the basis of the calculated distance. In this regard, the parallax acquisition portion 414 and the distance acquisition portion 416 are examples of information acquisition devices to acquire information such as distance information with respect to a subject. That is, the distance information is information with respect to the parallax, the amount of defocus, the distance to a subject, and the like. The collision decision portion 418 may determine a collision possibility by using any one of the distance information. The above-described various processing apparatuses may be realized by using specifically designed hardware or may be realized by using general-purpose hardware that performs computation on the basis of software modules. The processing apparatuses may be realized by Field Programmable Gate Array (FPGA), Application Specific Integrated Circuit (ASIC), and the like or may be realized by combining these.

The imaging system 400 is connected to a car information acquisition apparatus 420 and can acquire car information such as a car speed, a yaw rate, a rudder angle, and the like. In addition, the imaging system 400 is connected to a control ECU 430 that is a control apparatus to output a control signal for generating a braking force with respect to a car on the basis of the decision result of the collision decision portion 418. That is, the control ECU 430 is an example of mobile unit control devices to control a mobile unit on the basis of the distance information. Further, the imaging system 400 is also connected to an alarm 440 that gives an alarm to a driver on the basis of the decision result of the collision decision portion 418. For example, when a collision possibility is high as a result of the decision of the collision decision portion 418, the control ECU 430 performs car control to avoid collision and reduce damage by applying brakes, releasing the accelerator, reducing an engine output, and so forth. The alarm 440 gives an alarm to a user by generating, for example, an audible alarm, displaying alarm information on a screen of car navigation system or the like, vibrating a seat belt or steering, and so forth.

In the present embodiment, the circumferences of a car, for example, the front or the rear, are imaged by using the imaging system 400. FIG. 7B illustrates the imaging system 400 when imaging the front of a car (imaging range 450). The car information acquisition apparatus 420 sends an order to operate the imaging system 400 and to perform imaging. The accuracy of distance measurement of the imaging system 400 according to the present embodiment can be improved by using the photoelectric conversion apparatus according to an embodiment of the present disclosure as the photoelectric conversion apparatus 410.

The example in which control is performed so as to avoid collision with another car is described above. The imaging system 400 can also be applied to, for example, control in which automatic operation following another car is performed and control in which automatic operation is performed without straying from the traffic lane. Further, the imaging system can be applied to mobile units (transportation apparatuses), for example, ships, aircraft, and industrial robots, not limited to vehicles such as automobiles. The movement apparatuses in the mobile units (transportation apparatuses) are various movement devices such as engines, motors, wheels, and propellers. In addition, the imaging system can be widely applied to equipment exploiting object recognition, for example, the intelligent transport system (ITS), not limited to the mobile unit.

EXAMPLES

The present disclosure will be specifically described below with reference to the examples, but the present disclosure is not limited to the following examples within the bound of not departing from the scope of the present disclosure.

Example 1

In the present example, the photoelectric conversion element illustrated in FIG. 1A was produced as described below. A substrate 1 with the first-electrode-side surface insulated by a silicon oxide film was prepared, a TiN film was formed as a first electrode 2 by using a sputtering method, and a titanium oxide $TiO_2$ film was formed as a first interface layer 3 by using a sputtering method. The first interface layer 3 was coated, by using a spin coating method, with a PbS quantum dot dispersion liquid subjected to ligand exchange with TBAI in advance, and thereafter a ligand solution containing an organic ligand benzenedithiol (1,4-BDT) having a small molecular chain length was also applied. Subsequently, $PBI_2$ was further applied to perform switching to an inorganic ligand so as to form a photoelectric conversion layer 4. That is, switching to an inorganic ligand was performed after switching to an organic ligand. Provision of an inorganic ligand was performed by adding TBAI during synthesis in a liquid phase in advance, and provision of an organic ligand and provision of an inorganic ligand thereafter, that is, provision of a halogen ligand, were performed in a solid phase. The photoelectric conversion layer 4 was composed of a first region 4a (quantum dot film), and the first region 4a was stacked with an interface 4c interposed therebetween. The resulting photoelectric conversion layer 4 was left to stand for a night in a glove box in a nitrogen atmosphere (oxygen concentration of 1 ppm or less, moisture concentration of 1 ppm or less) so as to be dried. Molybdenum oxide $MoO_3$ serving as a second interface layer 5 was formed on the photoelectric conversion layer 4 by using a vacuum vapor deposition method. Tin-containing indium oxide ITO serving as a transparent conductive film was formed as the second electrode 6 on the second interface layer 5 by using a sputtering method.

Example 2

In the present example, a photoelectric conversion element was produced in the same steps as in example 1 except that the inorganic ligand applied to the photoelectric conversion layer was changed to $PbCl_2$.

Comparative Example 1

In comparative example 1, production was performed in the same steps as in example 1 except that ligand switching to the inorganic ligand was performed by using TBAI in a liquid phase before switching to the organic ligand. That is, in comparative example 1, switching to an inorganic ligand in a solid phase was not performed.

The measurement of the molar ratio of the halogen atom serving as the inorganic ligand of the quantum dot to the organic ligand was performed by using TOF-SIMS analysis. Specifically, PHI nano TOF II produced by ULVAC-PHI, Inc., was used as a TOF-SIMS analyzer, a primary ion was $Bi_3^{++}$, a primary ion acceleration voltage was 30 kV, and positive or negative of the secondary ion polarity was evaluated.

Figure 3:
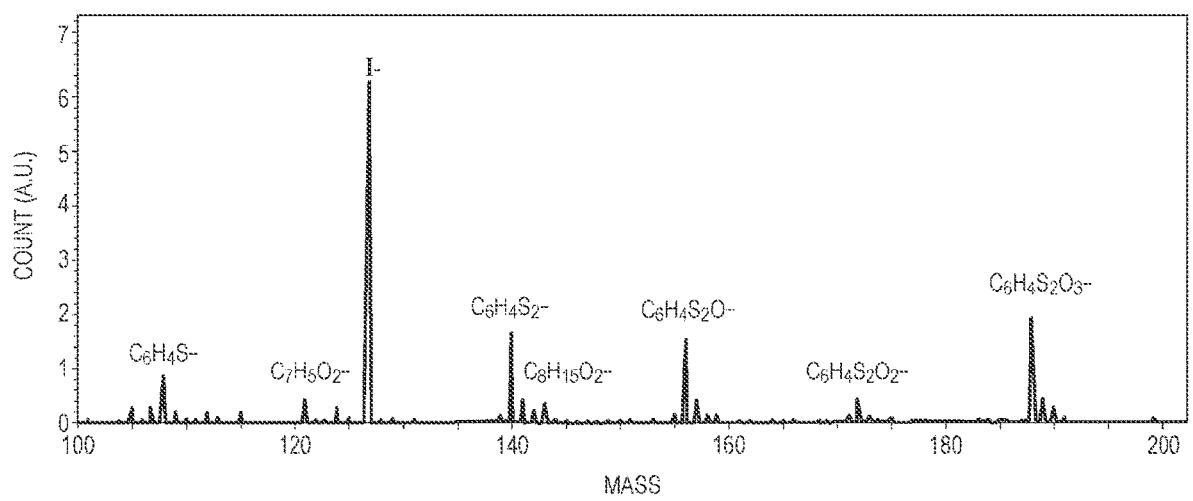
FIG. 3 is a diagram illustrating the TOF-SIMS analysis result of the surface of a quantum dot film in an example.

FIG. 3 is a diagram illustrating the TOF-SIMS analysis result of the surface of a quantum dot film used for the photoelectric conversion element 1a formed from the quantum dot film in example 1.

Figure 4A:
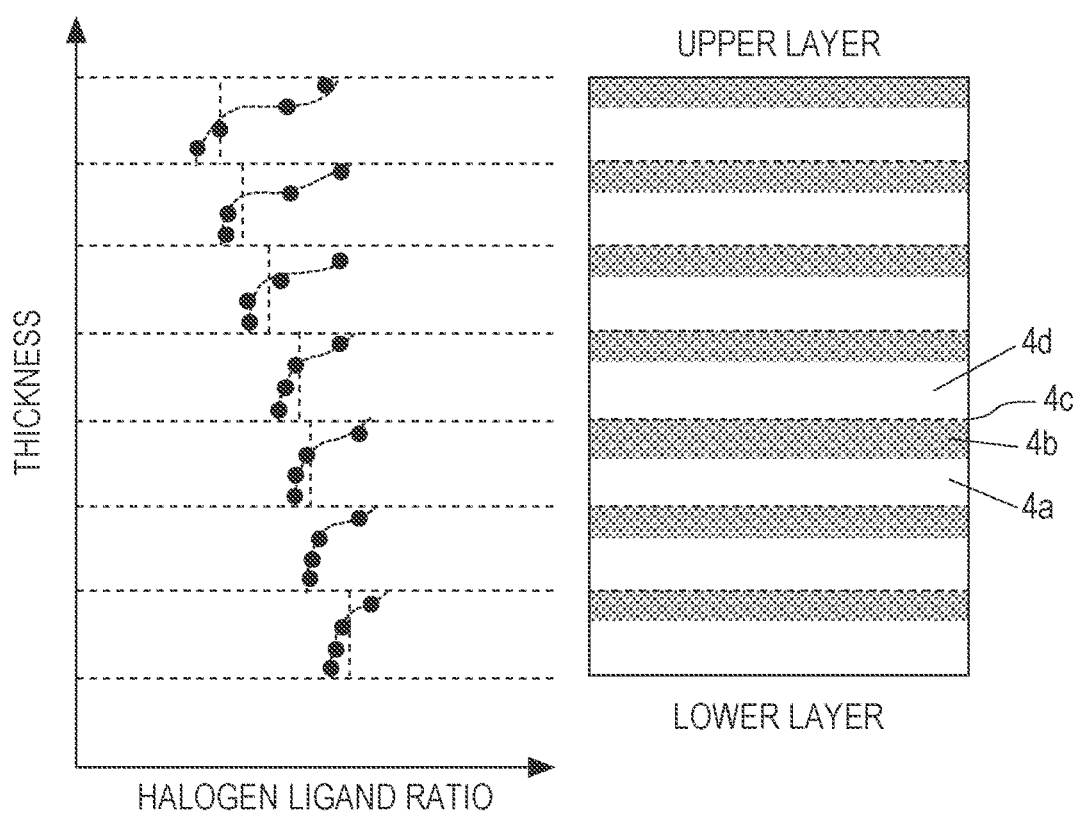
FIG. 4A is a diagram illustrating the distribution of the ligand ratio in the depth direction obtained from the TOF-SIMS analysis result of a quantum dot film in an example.

FIG. 4A is a diagram illustrating the distribution of the ligand ratio in the depth direction obtained from the TOF-SIMS analysis result of a quantum dot film used for the photoelectric conversion element 1a formed from the quantum dot film in example 1. The ligand ratio was calculated from the peak ratio obtained in TOF-SIMS. Specifically, the ratio of the iodine ion $I^-$ to the ratio of the organic compound ion $C_6H_4S_2^-$ was taken as the halogen ligand ratio. The peak of $C_6H_4S_2^-$ is a peak attributed to dibenzothiol and, therefore, represents the peak of the organic ligand, and $I^-$ is a peak attributed to $PbI_2$ and, therefore, represents the peak of the halogen ligand.

An average halogen ligand ratio in the quantum dot film is indicated by a broken line in FIG. 4A. There is a second region 4b (cap layer) in which the inorganic ligand ratio is higher than the average inorganic ligand ratio in the quantum dot film. As is clear from comparisons of average halogen ligand ratios of the plurality of photoelectric conversion layers with each other, the ratio increases with increasing proximity to the substrate. In FIG. 4A, "increasing proximity to the substrate" denotes a layer located at a lower level, and the lower layer has a higher inorganic ligand ratio. It can be said that as the location of the layer is lowered, the broken line is shifted toward right. It is conjectured that the lower layer having a higher inorganic ligand ratio is due to permeation of the inorganic ligand into the lower layer every time the upper layer is provided with the inorganic ligand.

Figure 4B:
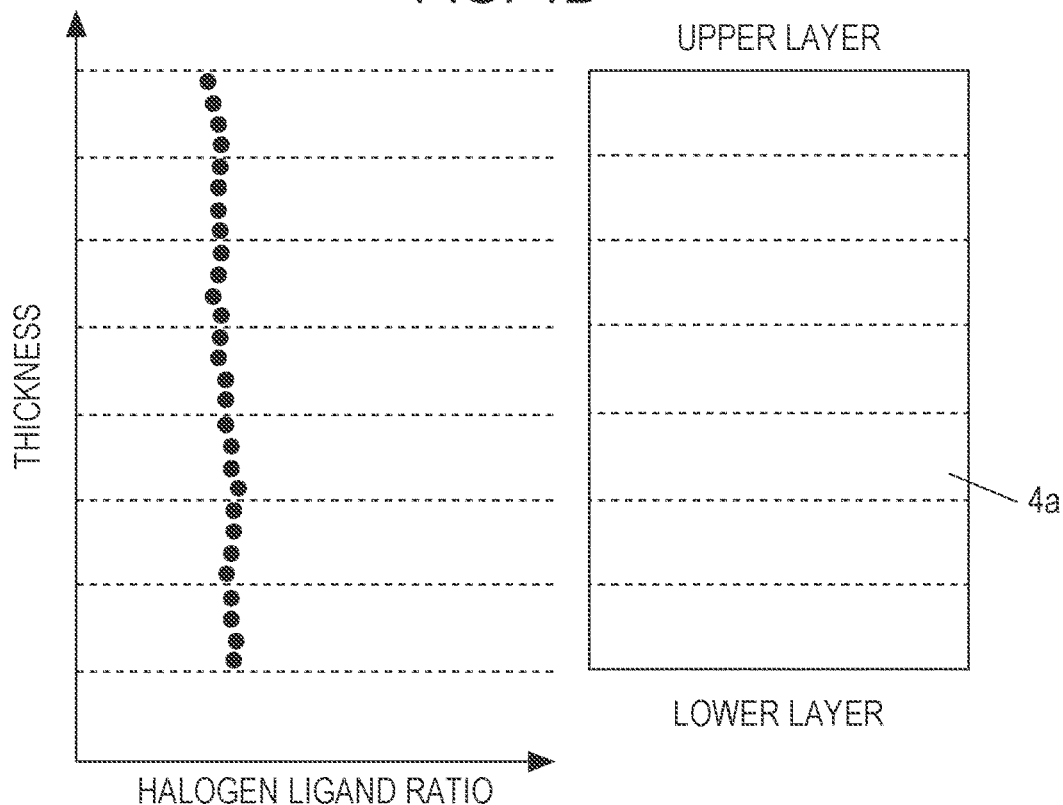
FIG. 4B is a diagram illustrating the distribution of the ligand ratio in the depth direction obtained from the TOF-SIMS analysis result of a quantum dot film in a comparative example.

FIG. 4B is a diagram illustrating the distribution of the ligand ratio in the depth direction obtained from the TOF-SIMS analysis result of the quantum dot film used for the photoelectric conversion element 1r formed from the quantum dot film in an example in the related art. Since the photoelectric conversion element 1r is not subjected to switching to a halogen ligand in a solid phase, in the multilayer structure of the quantum dot film, the halogen ligand ratio in the first region (quantum dot film) is constant.

Electrical Characteristics

Regarding the produced photoelectric conversion element, the electrical conductivity of the photoelectric conversion element was evaluated by using a semiconductor parameter analyzer. Initially, in the state in which the photoelectric conversion element was not irradiated with light, an applied voltage to the electrode was swept between −5 V to 5 V so as to acquire I-V characteristics in a dark condition. The current value in the state in which a bias of +2 V was applied was taken as a dark current value Id. The value of photocurrent in the state in which the photoelectric conversion element was irradiated with monochromatic light (irradiation intensity of 5 µW/cm$^2$) was evaluated. The measurement was performed while the wavelength of the monochromatic light was changed from 300 nm to 1,200 nm in steps of 5 nm. The increment of the current from the dark current when the light with a wavelength of 600 nm was applied was taken as the photocurrent Ip. To examine the heat resistance of the photoelectric conversion element, the photoelectric conversion element after being completed was heated in the air at 150° C. for 1 hour.

The dark current and the photocurrent of the photoelectric conversion element produced in example 1 were evaluated. Table 1 describes the values of the photocurrent Ip, the external quantum efficiency, and the dark current of the photoelectric conversion element.

Regarding the photoelectric conversion element 1a, the dark current was reduced, and the long-wavelength-side photocurrent was increased compared with the photoelectric conversion element 1r of the comparative example. It is conjectured that an interface defect at the interface 4c in the photoelectric conversion layer 4 was repaired so as to reduce the dark current derived from the interface defect. A defect is readily generated on the quantum dot surface. The second region 4b (cap layer) having many halogen ligands being disposed repairs a surface defect of the quantum dot film. Regarding the photoelectric conversion layer 4, long-wavelength light has a smaller absorption coefficient than short-wavelength light and, therefore, reaches the substrate-side layer at a deeper position in the photoelectric conversion layer 4. It is conjectured that the inorganic ligand ratio of the substrate-side layer of the photoelectric conversion layer 4 being higher than the inorganic ligand ratio of the surface-side layer reduces the defect level density of the lower layer so as to improve the long-wavelength-side photocurrent.

Regarding the photoelectric conversion element 1b, the dark current was reduced compared with the photoelectric conversion element 1r of the comparative example, and the long-wavelength-side photocurrent was larger than the photocurrent of the photoelectric conversion element 1a. Regarding the photoelectric conversion element 1b, a halogen atom different from the halogen atom added in the liquid phase was added in the solid phase. In the liquid phase, the inorganic ligand containing iodine was used, and in the solid phase, an inorganic ligand containing chlorine was used. Chlorine is a halogen atom having a smaller atomic radius than iodine. The defect level of the quantum dot film which could not be repaired during formation of the quantum dot film was repaired by a different halogen atom in the solid phase. After ligand exchange is performed by a large halogen atom in the liquid phase, ligand exchange by a smaller halogen atom is performed in the solid phase. Consequently, the smaller halogen atom entering a region which the large halogen atom cannot enter enables a defect to be repaired.

A plurality of types of inorganic ligands containing a halogen atom to perform ligand exchange in the solid phase may be mixed. It is also effective that the type of the ligand is changed in midstream when ligand exchange is repeated a plurality of times. Regarding the inorganic ligand containing a halogen atom, a plurality of types of ligands having different sizes being combined enables the ligand to densely enter the interior of the quantum dot film.

a long molecular length was used. Since halogen was not added during synthesis of the PbS quantum dot, aggregation of the quantum dot did not readily occur, and the usable period of the quantum dot solution was relatively long. In the step of providing the organic ligand, benzenedithiol (1,4-BDT) which is an organic ligand having a small molecular chain length was used as the ligand. An element produced by using $PbI_2$ containing iodine as the inorganic ligand provided during film formation was taken as the photoelectric conversion element 2a.

In the same manner as in example 1, the ligand ratio of the inorganic ligand to the organic ligand in the thickness direction of the photoelectric conversion layer constituting the photoelectric conversion element 2a was analyzed.

Figure 5:
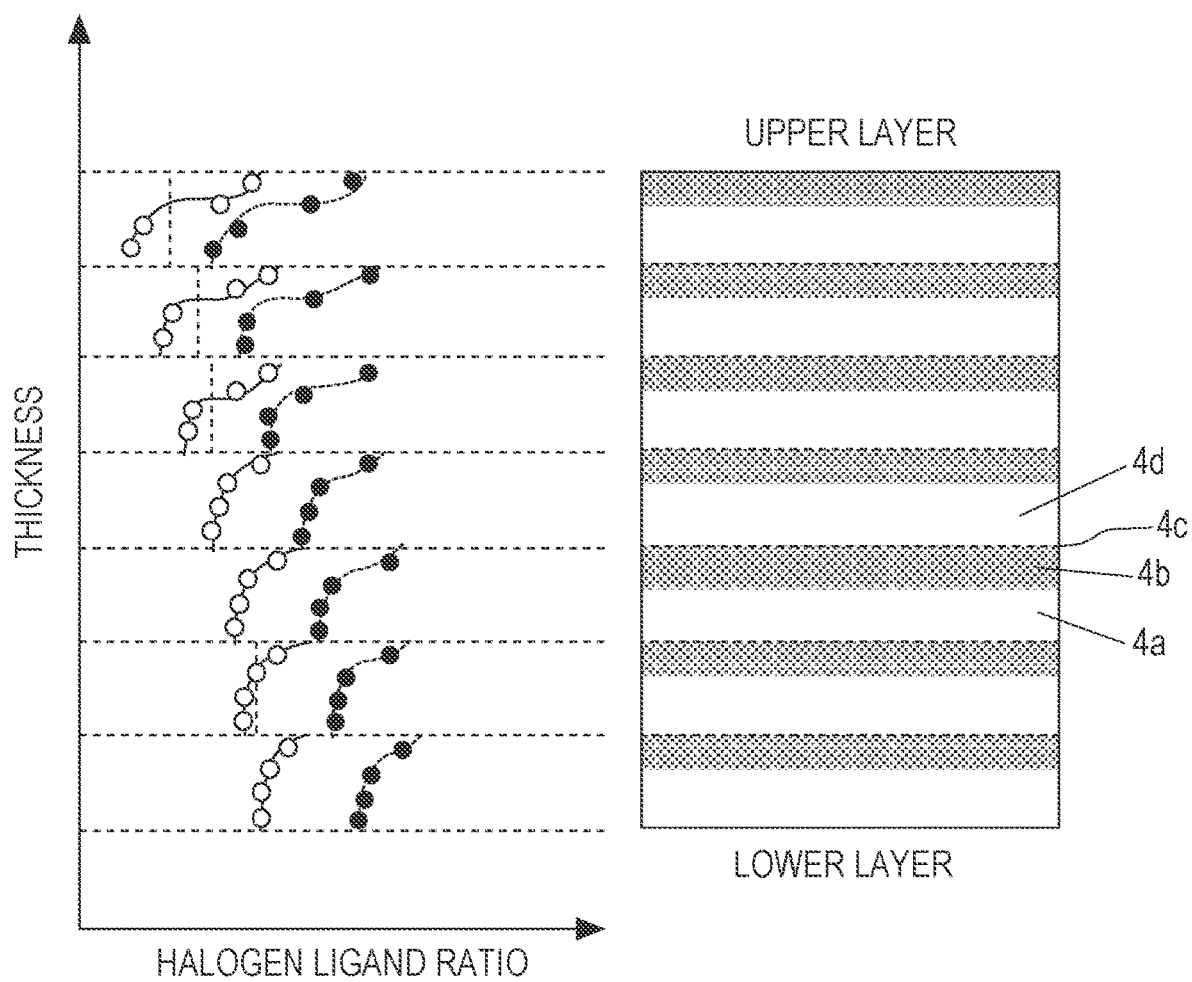
FIG. 5 is a diagram illustrating the distribution of the ligand ratio in the depth direction obtained from the TOF-SIMS analysis result of a quantum dot film in another example.

FIG. 5 is a diagram illustrating the ligand ratio in the depth direction obtained from the TOF-SIMS analysis result of the quantum dot film used for the photoelectric conversion element 2a formed from the quantum dot film according to the present example. FIG. 5 illustrates the halogen ligand ratio of the element produced in example 3 and the halogen ligand ratio of the element produced in example 1. In example 3, since the inorganic ligand is not provided during synthesis, the inorganic ligand ratio is reduced in general. In example 3, there is also a second region 4b (cap layer) in which the inorganic ligand ratio is higher than the average value of the inorganic ligand ratio in each layer of the first region 4a (quantum dot film) constituting the photoelectric conversion layer 4 as in example 1.

Example 4

A photoelectric conversion element was produced in the same steps as in example 3 except that production was performed by repeating the step of providing the inorganic ligand three times after the ligand switching to the organic ligand was performed. The element produced in the present example was taken as the photoelectric conversion element 2b.

The dark current and the photocurrent were evaluated as the electrical performance of the photoelectric conversion elements 2a and 2b produced in examples 3 and 4. Table 2 describes the values of the photocurrent Ip, the external quantum efficiency, and the dark current of the photoelectric conversion element. The photoelectric conversion element 2a has electrical performance substantially equivalent to that of the photoelectric conversion element 1a. Regarding the

TABLE 1

| Element name | Ligand in synthesis | Organic ligand | Inorganic ligand | Photocurrent Ip (A/cm2) | External quantum efficiency (500 nm) | External quantum efficiency (900 nm) | Dark current Id (A/cm2) |
|---|---|---|---|---|---|---|---|
| Element 1a | iodine oleic acid | 1,4-BDT | iodine | 1.5E−6 | 62% | 20% | 9.4E−9 |
| Element 1b | iodine oleic acid | 1,4-BDT | chlorine | 1.7E−6 | 63% | 21% | 9.5E−9 |
| Element 1r | iodine oleic acid | 1,4-BDT | none | 9.7E−7 | 50% | 15% | 1.2E−8 |

Example 3

Subsequently, in the present example, a photoelectric conversion element was produced in the same manner as in example 1 except that the inorganic ligand was not provided during synthesis of the PbS quantum dot and that a quantum dot provided with just oleic acid as the organic ligand having results of the photoelectric conversion element 2b, the dark current was slightly small and the photocurrent in the long-wavelength-region was large compared with the photoelectric conversion element 1a and the photoelectric conversion element 2a. This is an effect of the second ligand exchange being repeated three times so that the halogen atom permeated into the quantum dot film and a defect was reduced.

TABLE 2

| Element name | Ligand in synthesis | Organic ligand | Inorganic ligand | Photocurrent Ip (A/cm2) | External quantum efficiency (500 nm) | External quantum efficiency (900 nm) | Dark current Id (A/cm2) |
|---|---|---|---|---|---|---|---|
| Element 2a | oleic acid | 1,4-BDT | iodine | 1.4E−6 | 62% | 20% | 9.3E−9 |
| Element 2b | oleic acid | 1,4-BDT | iodine × 3 times | 1.6E−6 | 63% | 22% | 9.0E−9 |

According to the present disclosure, a photoelectric conversion element having a high photocurrent density due to a reduction of a surface defect of a quantum dot can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A photoelectric conversion element comprising:
a first electrode;
a second electrode; and
a photoelectric conversion layer disposed between the first electrode and the second electrode,
wherein the photoelectric conversion layer includes a first region, a second region disposed between the first region and the second electrode, and a third region that is disposed between the second region and the second electrode and that is in contact with the second region,
an inorganic ligand ratio in the second region is higher than an inorganic ligand ratio in the first region,
an inorganic ligand ratio at the interface of the third region to the second region is lower than the inorganic ligand ratio in the first region, and
the inorganic ligand ratio in the second region increases with increasing proximity to the third region.

2. The photoelectric conversion element according to claim 1, wherein the inorganic ligand ratio in the second region monotonously increases with increasing proximity to the third region.

3. The photoelectric conversion element according to claim 1, wherein a difference between a maximum value of the inorganic ligand ratio in the second region and the minimum value of the inorganic ligand ratio in the second region is less than a difference between the maximum value of the inorganic ligand ratio in the second region and the average value of the inorganic ligand ratio in the third region.

4. The photoelectric conversion element according to claim 1, wherein the inorganic ligand ratio in the first region increases with increasing proximity to the second region.

5. The photoelectric conversion element according to claim 4, wherein an increase rate of the inorganic ligand ratio in the first region is more than the increase rate of the inorganic ligand ratio in the second region.

6. The photoelectric conversion element according to claim 1, wherein a thickness of the first region in the direction from the first electrode toward the second electrode is more than a thickness of the second region.

7. The photoelectric conversion element according to claim 1, wherein the total of a thickness of the first region and a thickness of the second region is more than a thickness of the third region.

8. The photoelectric conversion element according to claim 1, wherein the standard deviation of the inorganic ligand ratio in the first region is less than the standard deviation of the inorganic ligand ratio in the second region.

9. The photoelectric conversion element according to claim 1, wherein the standard deviation of the inorganic ligand ratio in the second region is more than the standard deviation of the inorganic ligand ratio in the third region.

10. The photoelectric conversion element according to claim 1, wherein the inorganic ligand is a ligand having a halogen atom.

11. The photoelectric conversion element according to claim 1, wherein the inorganic ligand is a ligand selected from the group consisting of lead fluoride, lead chloride, lead iodide, lead bromide, and tetrabutylammonium iodide.

12. The photoelectric conversion element according to claim 10, wherein a maximum peak in TOF-SIMS attributed to a halogen atom in the second region is higher than a maximum peak in TOF-SIMS attributed to a halogen atom in the first region.

13. The photoelectric conversion element according to claim 10, wherein a maximum peak in TOF-SIMS attributed to a halogen atom in the third region is lower than a maximum peak in TOF-SIMS attributed to a halogen atom in the first region.

14. The photoelectric conversion element according to claim 1,
wherein a first photoelectric conversion layer and a second photoelectric conversion layer are included between the first electrode and the second electrode, the second photoelectric conversion layer being disposed between the first photoelectric conversion layer and the second electrode,
the first region and the second region are included in the first photoelectric conversion layer, and
the third region is included in the second photoelectric conversion layer.

15. The photoelectric conversion element according to claim 14, wherein a maximum peak in TOF-SIMS attributed to a halogen atom in the first photoelectric conversion layer is higher than a maximum peak in TOF-SIMS attributed to a halogen atom in the second photoelectric conversion layer.

16. An imaging element comprising:
the photoelectric conversion element according to claim 1; and
a signal processing circuit connected to the photoelectric conversion element.

17. A photoelectric conversion apparatus comprising:
an optical system including a plurality of lenses; and
a light-receiving element to receive the light passed through the optical system,
wherein the light-receiving element includes the photoelectric conversion element according to claim 1.

18. A mobile unit comprising:
a bodywork provided with the photoelectric conversion element according to claim 1; and
a moving device to move the bodywork.

\* \* \* \* \*